(12) United States Patent
Fang et al.

(10) Patent No.: US 9,484,337 B2
(45) Date of Patent: Nov. 1, 2016

(54) CIRCUIT PROTECTION DEVICE

(71) Applicant: Tyco Electronics (Shanghai) Co. Ltd., Shanghai (CN)

(72) Inventors: Yan Fang, Shanghai (CN); Bin Wang, Shanghai (CN); Jianzhe Ye, Shanghai (CN); Tao Guo, Shanghai (CN); Jianyong Liu, Shanghai (CN)

(73) Assignee: TYCO ELECTRONICS (SHANGHAI) CO. LTD., Shanghai (CN)

( * ) Notice: Subject to any disclaimer, the term of this patent is extended or adjusted under 35 U.S.C. 154(b) by 0 days.

(21) Appl. No.: 14/835,150

(22) Filed: Aug. 25, 2015

(65) Prior Publication Data
US 2016/0056139 A1  Feb. 25, 2016

(30) Foreign Application Priority Data
Aug. 25, 2014  (CN) ...................... 2014 2 0481154 U

(51) Int. Cl.
| H01L 23/52 | (2006.01) |
| H01L 27/02 | (2006.01) |
| H01L 23/62 | (2006.01) |
| H01L 29/861 | (2006.01) |
| H01L 23/525 | (2006.01) |

(52) U.S. Cl.
CPC ....... *H01L 27/0248* (2013.01); *H01L 23/5256* (2013.01); *H01L 23/62* (2013.01); *H01L 29/861* (2013.01)

(58) Field of Classification Search
CPC .......... H01L 27/0248; H01L 27/0207; H01L 23/49811; H01L 23/5256; H01L 23/49827; H01L 23/49844; H01L 27/02; H01L 23/62; H01L 29/861; H01L 23/498
See application file for complete search history.

(56) References Cited

U.S. PATENT DOCUMENTS

2002/0039270 A1* 4/2002 Sato ...................... H02H 9/042
361/93.1

* cited by examiner

*Primary Examiner* — Charles Garber
*Assistant Examiner* — Abdulfattah Mustapha

(57) ABSTRACT

A circuit protection device is provided and includes a first insulation layer, a second insulation layer, a thermal fuse, a diode, a first exterior electrode pad, a second exterior electrode pad, and a third exterior electrode pad. The second insulation layer is positioned above a top surface of the first insulation layer. The thermal fuse is packaged in the first insulation layer and having a first electrode end and a second electrode end positioned opposite to the first electrode end. The diode is packaged in the second insulation layer and having a first electrode surface and a second electrode surface positioned opposite to the first electrode surface. The first exterior electrode pad is positioned on a bottom surface of the first insulation layer and electrically connected to the first electrode surface and the first electrode end. The second exterior electrode pad is positioned on the bottom surface and electrically connected to the second electrode end, while the third exterior electrode pad is positioned on the bottom surface and electrically connected to the second electrode surface.

16 Claims, 2 Drawing Sheets

CIRCUIT PROTECTION DEVICE

CROSS-REFERENCE TO RELATED APPLICATION

This application claims the benefit of the filing date under 35 U.S.C. §119(a)-(d) of Chinese Patent Application No. 201420481154.2 filed on Aug. 25, 2014.

FIELD OF THE INVENTION

The invention relates to a circuit protection device and, more particularly, to a circuit protection device having a thermal fuse.

BACKGROUND

It is known to use a thermal fuse and a diode to achieve overcurrent and overvoltage protection for a circuit. Generally, the known thermal fuse is connected in series with the protected circuit, and the diode has a cathode end connected to the protected circuit and a grounded anode end. When an overcurrent flows through the circuit, the thermal fuse will be heated up and blown, so that the circuit is switched off timely, thereby electrical devices and apparatus connected with the circuit are protected. When the circuit is applied with an overvoltage, the diode will be reversely broken-down, and an electrical current will flow directly from the diode to an ground terminal, so that a voltage from an output terminal of the circuit is pulled down to a low voltage in an instant; meanwhile, the thermal fuse will heat up and fails, and finally the circuit is switched off. Thereby, electrical devices and apparatus connected with the circuit are protected.

In known designs, however, the thermal fuse and the diode are discrete parts separated from each other, and need to be independently welded onto the protected circuit through lead wires, which is time-consuming and laborious and inconvenient to use. In addition, it will lead to an incompact overall structure and a larger volume of the circuit.

Therefore, it would be advantageous to provide a circuit protection device, which is very convenient to use, thereby time and labor are saved. Also, it would also be advantageous to provide a circuit protection device with a compact structure and a smaller volume.

SUMMARY

The invention has been made to overcome or alleviate at least one aspect of the above mentioned problems and disadvantages.

Accordingly, a circuit protection device according to the invention is provided and includes a first insulation layer, a second insulation layer, a thermal fuse, a diode, a first exterior electrode pad, a second exterior electrode pad, and a third exterior electrode pad. The second insulation layer is positioned above a top surface of the first insulation layer. The thermal fuse is packaged in the first insulation layer and having a first electrode end and a second electrode end positioned opposite to the first electrode end. The diode is packaged in the second insulation layer and having a first electrode surface and a second electrode surface positioned opposite to the first electrode surface. The first exterior electrode pad is positioned on a bottom surface of the first insulation layer and electrically connected to the first electrode surface and the first electrode end. The second exterior electrode pad is positioned on the bottom surface and electrically connected to the second electrode end, while the third exterior electrode pad is positioned on the bottom surface and electrically connected to the second electrode surface.

BRIEF DESCRIPTION OF THE DRAWINGS

The above and other features and advantages of the invention will become more apparent by describing in detail exemplary embodiments thereof with reference to the accompanying drawings, in which.

DETAILED DESCRIPTION OF THE EMBODIMENT(S)

Figure 1:
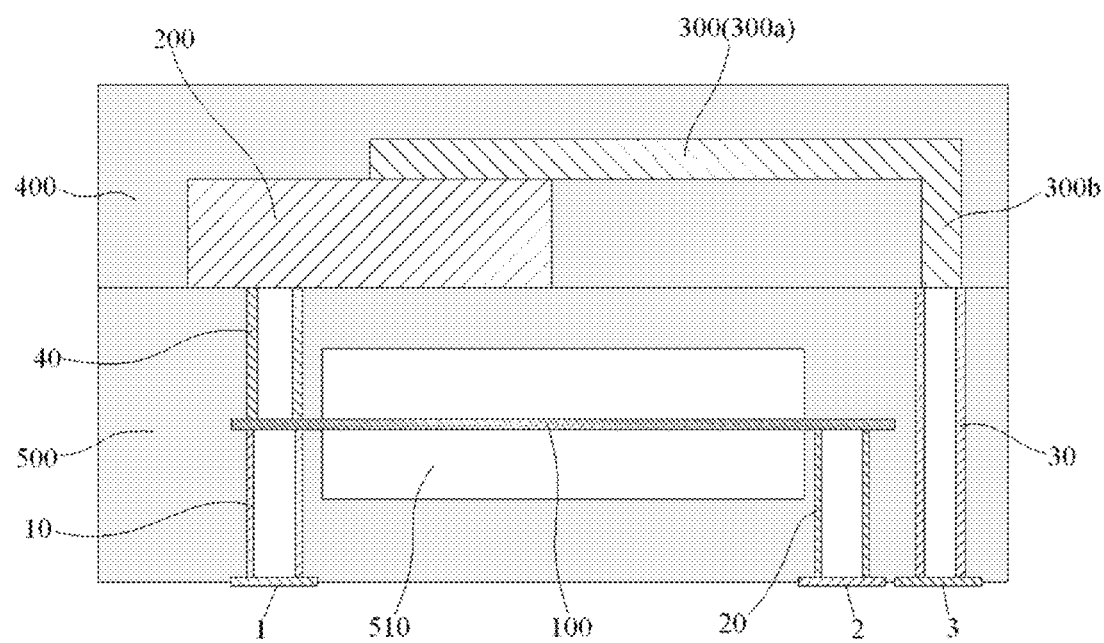
FIG. 1 is a schematic cross sectional view showing a circuit protection device according to the invention.

Exemplary embodiments of the invention will be described hereinafter in detail with reference to the attached drawings, wherein the like reference numbers refer to the like elements. The invention may, however, be embodied in many different forms and should not be construed as being limited to the embodiment set forth herein; rather, these embodiments are provided so that the invention will be thorough and complete, and will fully convey the concept of the disclosure to those skilled in the art.

In the following detailed description, for purposes of explanation, numerous specific details are set forth in order to provide a thorough understanding of the disclosed embodiments.

However, it will be apparent that one or more embodiments may be practiced without these specific details. In other instances, well-known structures and devices are schematically shown in order to simplify the drawing.

With reference to FIG. 1, a circuit protection device according to the invention is shown and generally includes a thermal fuse 100 and a diode 200.

In the shown embodiment, the thermal fuse 100 has a first electrode end (the left end in FIG. 1) and a second electrode end (the right end in FIG. 1) opposite to the first electrode end.

In the shown embodiment, as shown in FIG. 1, the diode 200 has a first electrode surface (the lower surface in FIG. 1) and a second electrode surface (the upper surface in FIG. 1) opposite to the first electrode surface.

As shown in FIG. 1, the thermal fuse 100 is packaged in a first insulation layer 500, the first electrode surface of the diode 200 is fitted on a top surface of the first insulation layer 500, and the diode 200 is packaged in a second insulation layer 400.

With continued reference to FIG. 1, in the shown embodiment, the first electrode surface of the diode 200 is electrically connected to the first electrode end of the thermal fuse 100 through a conductive through hole 40 formed in the first insulation layer 500.

As shown in FIG. 1, a first exterior electrode pad 1, a second exterior electrode pad 2 and a third exterior electrode pad 3 are provided on a bottom surface of the first insulation layer 500. In the shown embodiment, lower surfaces of the first exterior electrode pad 1, the second exterior electrode pad 2 and the third exterior electrode pad 3 are positioned along a common plane, such that the first exterior electrode pad 1, the second exterior electrode pad 2 and the third exterior electrode pad 3 may be soldered to a circuit board in one single process through surface mounting technology (SMT), thereby providing efficient operation.

In the embodiment shown in FIG. 1, the first electrode surface of the diode 200 and the first electrode end of the thermal fuse 100 are electrically connected to the first exterior electrode pad 1, the second electrode end of the thermal fuse 100 is electrically connected to the second exterior electrode pad 2, and the second electrode surface of the diode 200 is electrically connected to the third exterior electrode pad 3. In such a manner, the thermal fuse 100 and the diode 200 can be electrically connected to the protected circuit through the first exterior electrode pad 1, the second exterior electrode pad 2 and the third exterior electrode pad 3 without using lead wires, and thus providing efficient operation.

As shown in FIG. 1, the first exterior electrode pad 1 is electrically connected to the first electrode end of the thermal fuse 100 through a first conductive through hole 10 formed in the first insulation layer 500.

In the shown embodiment, the second exterior electrode pad 2 is electrically connected to the second electrode end of the thermal fuse 100 through a second conductive through hole 20 formed in the first insulation layer 500.

As shown in FIG. 1, the circuit protection device further includes an electrical connection member 300 packaged in the second insulation layer 400, the electrical connection member 300 has one end electrically connected to the second electrode surface of the diode 200 and the other end electrically connected to the third exterior electrode pad 3 through a third conductive through hole 30 formed in the first insulation layer 500.

In the shown embodiment, the electrical connection member 300 is a plate shaped electrical connection sheet. The electrical connection member 300 includes a first portion 300a and a second portion 300b. The first portion 300a of the electrical connection member 300 is parallel to and electrically connected to the second electrode surface of the diode 200. The second portion 300b of the electrical connection member 300 is perpendicular to the first portion 300a and electrically connected to the third conductive through hole 30.

In shown embodiment, the first insulation layer 500 is formed into a plate shape, and the diode 200 is formed into a sheet shape and stacked on the first insulation layer 500, which can reduce the thickness of the circuit protection device.

In shown embodiment, as shown in FIG. 1, a fuse receiving cavity 510 is provided in the first insulation layer 500, and a middle part of the thermal fuse 100 is received within the fuse receiving cavity 510. The first and second electrode ends of the thermal fuse 100 are held in the first insulation layer 500.

Figure 2:
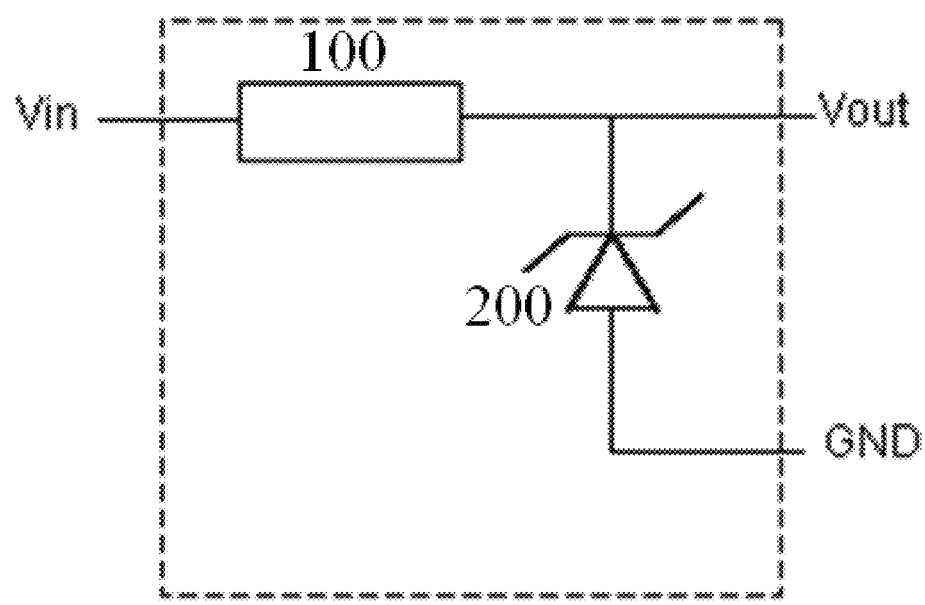
FIG. 2 is a schematic circuit diagram of the circuit protection device shown in FIG. 1.

Now with reference to FIG. 2, a schematic circuit diagram is shown. In the shown embodiment, the first electrode surface of the diode 200 is a cathode surface, and the second electrode surface of the diode 200 is an anode surface.

As shown in FIG. 1 and FIG. 2, the second exterior electrode pad 2, which is electrically connected to the second electrode end of the thermal fuse 100, is a voltage or current input terminal Vin shown in FIG. 2.

In the shown embodiment, the first exterior electrode pad 1, which is electrically connected to the first electrode end of the thermal fuse 100 and the first electrode surface of the diode 200, is a voltage or current output terminal Vout shown in FIG. 2.

In the shown embodiment, the third exterior electrode pad 3, which is electrically connected to the second electrode surface of the diode 200, is a ground terminal GND shown in FIG. 2.

As provided by FIG. 2, when a large electrical current flows through the circuit and the thermal fuse 100, a rapid temperature rise occurs and the thermal fuse 100 breaks down, thereby enabling overcurrent protection for the circuit in time. When the circuit is applied with an overvoltage, the diode 200 will be reversely broken-down by an over-high voltage, and an electrical current will flow directly from the diode 200 to the ground terminal, so that an voltage from the output terminal of the circuit is pulled down to a low voltage in an instant. Meanwhile, over-high fault current flows through the thermal fuse 100 and the diode 200, the thermal fuse will be heated up and blown, and finally the circuit is switched off. In the present disclosure, parameters of the thermal fuse and the diode 200 may be suitably designed and selected so that the thermal fuse 100 is capable of being blown before the diode 200 is damaged.

It will be appreciated by those skilled in the art the above described embodiments are exemplary, and may be improved by those skilled in the art. The structures described in various embodiments may be combined freely without conflict in arrangement or principle.

Although the present disclosure has been described in conjunction with the attached drawings, the embodiments shown in the drawings are intended to exemplarily illustrate preferred embodiments of the invention, and should not be interpreted as being limitative to the invention.

Although several exemplary embodiments of the general inventive concept have been shown and described, it would be appreciated by those skilled in the art that various changes or modifications may be made in these embodiments without departing from the principles and spirit of the invention, the scope of the invention is thereby defined in the claims and their equivalents.

It should be noted the term "comprise" does not exclude other elements or steps, and the term "a" or "an" does not exclude a plurality of elements or steps. Further, any reference number in claims should not be interpreted as being limitative to the scope of the invention.

What is claimed is:
1. A circuit protection device, comprising:
a first insulation layer;
a second insulation layer positioned above a top surface of the first insulation layer;
a thermal fuse packaged in the first insulation layer and having a first electrode end and a second electrode end positioned opposite to the first electrode end;
a diode packaged in the second insulation layer and having a first electrode surface and a second electrode surface positioned opposite to the first electrode surface;
a first exterior electrode pad positioned on a bottom surface of the first insulation layer and electrically connected to the first electrode surface of the diode and the first electrode end of the thermal fuse;
a second exterior electrode pad positioned on the bottom surface of the first insulation layer and electrically connected to the second electrode end of the thermal fuse; and
a third exterior electrode pad positioned on the bottom surface of the first insulation layer and electrically connected to the second electrode surface of the diode.

2. The circuit protection device according to claim 1, wherein the first electrode surface of the diode is positioned on the top surface of the first insulation layer.

3. The circuit protection device according to claim 1, further comprising a conductive through hole extending through the first insulation layer and electrically connecting the first electrode surface to the first electrode end of the thermal fuse.

4. The circuit protection device according to claim 1, wherein the first insulation layer is plate shaped.

5. The circuit protection device according to claim 4, wherein the first exterior electrode pad is electrically connected to the first electrode end of the thermal fuse through a first conductive through hole provided in the first insulation layer.

6. The circuit protection device according to claim 5, wherein the second exterior electrode pad is electrically connected to the second electrode end of the thermal fuse through a second conductive through hole provided in the first insulation layer.

7. The circuit protection device according to claim 6, further comprising an electrical connection member having an end electrically connected to the second electrode surface of the diode and an opposite end electrically connected to the third exterior electrode pad through a third conductive through hole provided in the first insulation layer.

8. The circuit protection device according to claim 7, wherein the electrical connection member includes a first portion positioned parallel to and electrically connected to the second electrode surface of the diode.

9. The circuit protection device according to claim 8, wherein the electrical connection member further includes a second portion positioned perpendicular to the first portion and electrically connected to the third conductive through hole.

10. The circuit protection device according to claim 9, wherein the diode and the electrical connection member are packaged in the second insulation layer.

11. The circuit protection device according to claim 10, wherein the first electrode surface is a cathode surface and the second electrode surface is an anode surface.

12. The circuit protection device according to claim 11, wherein the second exterior electrode pad is a voltage or current input terminal.

13. The circuit protection device according to claim 12, wherein the first exterior electrode pad is a voltage or current output terminal.

14. The circuit protection device according to claim 13, wherein the third exterior electrode pad is a ground terminal.

15. The circuit protection device according to claim 14, wherein the first exterior electrode pad, the second exterior electrode pad, and the third exterior electrode pad are positioned along a common plane.

16. The circuit protection device according to claim 1, wherein the first insulation layer includes a fuse receiving cavity receiving a middle part of the thermal fuse.

* * * * *